United States Patent
Cetin et al.

(10) Patent No.: US 7,560,987 B1
(45) Date of Patent: Jul. 14, 2009

(54) AMPLIFIER CIRCUIT WITH BIAS STAGE FOR CONTROLLING A COMMON MODE OUTPUT VOLTAGE OF THE GAIN STAGE DURING DEVICE POWER-UP

(75) Inventors: Joseph A. Cetin, San Diego, CA (US); Matthew D. Sienko, La Jolla, CA (US); Jason F. Muriby, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 124 days.

(21) Appl. No.: 11/420,948

(22) Filed: May 30, 2006

Related U.S. Application Data

(60) Provisional application No. 60/688,289, filed on Jun. 7, 2005.

(51) Int. Cl.
*H03F 3/45* (2006.01)

(52) U.S. Cl. .................................................. 330/258

(58) Field of Classification Search .............. 330/9, 330/258, 51, 292, 259; 327/143, 337, 554, 327/560, 563
See application file for complete search history.

(56) References Cited

U.S. PATENT DOCUMENTS

| | | | |
|---|---|---|---|
| 4,996,498 A * | 2/1991 | Hanna | 330/258 |
| 5,087,891 A * | 2/1992 | Cytera | 330/288 |
| 5,300,822 A * | 4/1994 | Sugahara et al. | 327/142 |
| 5,568,089 A | 10/1996 | Maru | |
| 5,838,200 A | 11/1998 | Opris | |
| 5,963,156 A * | 10/1999 | Lewicki et al. | 341/122 |
| 6,346,854 B1 | 2/2002 | Heithoff | |
| 6,388,522 B1 | 5/2002 | Fattaruso et al. | |
| 6,577,184 B2 * | 6/2003 | Kwan et al. | 330/9 |
| 6,781,451 B2 * | 8/2004 | Kwan et al. | 330/9 |
| 6,819,185 B1 | 11/2004 | Jensen | |
| 6,998,917 B2 | 2/2006 | Kudo et al. | |
| 2002/0024384 A1 * | 2/2002 | Fattaruso et al. | 330/258 |
| 2003/0001674 A1 * | 1/2003 | Nagaraj | 330/258 |

* cited by examiner

*Primary Examiner*—Robert Pascal
*Assistant Examiner*—Khiem D Nguyen

(57) ABSTRACT

An improved amplifier circuit is provided herein with a gain stage and a bias stage, which may be switchably connected to the gain stage during power-up operations. The bias stage reduces a power-up time associated with the gain stage, while minimizing current consumption in the next amplifier stage and improving battery life. For example, during power-up, the bias stage may enable the output voltage of the gain stage to gradually rise from a ground potential to a desired common mode level in a highly controlled and predictable manner. By preventing "glitches" in the output voltage, the bias stage eliminates the need for inserting switches in the signal path between the output nodes of the gain stage and input nodes of the next amplifier stage.

14 Claims, 5 Drawing Sheets

AMPLIFIER CIRCUIT WITH BIAS STAGE FOR CONTROLLING A COMMON MODE OUTPUT VOLTAGE OF THE GAIN STAGE DURING DEVICE POWER-UP

PRIORITY CLAIM

This application claims priority to U.S. Provisional Application No. 60/688,289 filed Jun. 7, 2005.

BACKGROUND OF THE INVENTION

1. Field of the Invention

This invention relates to differential amplifier circuits and, more particularly, to amplifier circuit designs with reduced power-up time, reduced power consumption and improved reliability.

2. Description of the Related Art

The following descriptions and examples are not admitted to be prior art by virtue of their inclusion within this section.

Amplifiers are often used in integrated circuit design. Even in the case of digital integrated circuits, amplifiers may be used for purposes such as providing a reference voltage for other parts of the circuit. Amplifier circuits generally include a plurality of stages, such as an input stage, a gain stage and an output stage, among others. In differential designs, a pair of differential signals may be supplied to the input stage of the amplifier, the difference between which may be amplified (primarily) in the gain stage before it is supplied to a low impedance output stage.

Amplifiers use power from a DC power supply to produce an output signal with increased voltage and/or current with respect to the input signal(s) supplied thereto. Specialized amplifiers, known as operational amplifiers, exhibit extremely high voltage gain, high input impedance, and low output impedance. Operational amplifiers are useful in producing output voltages with specific mathematical relationships to the input voltages supplied thereto. Operations such as addition, subtraction, multiplication, division, differentiation, and integration can be realized by configuring the operational amplifier with additional circuit elements. For example, a voltage multiplier circuit can be formed using a resistor network with an operational amplifier to multiply a constant factor by an input reference voltage. In this way, a voltage reference can be made available to an integrated circuit.

A current trend in integrated circuit design is that the power supply voltages available to integrated circuits are continually being reduced. The reduction in power supply voltage is used to reduce overall power consumption of the integrated circuit, which may be particularly important for the use of portable and other battery operated devices, and to reduce heating problems caused by increasing circuit density. Early operational amplifiers often used power supply voltages on the order of ±10 volts or ±15 volts. Due to scaling transistor geometries, however, current integrated circuits typically use power supply voltages ranging from about 0 volts to about 3 volts, 2 volts, or less. Unfortunately, conventional operational amplifier designs often suffer from degraded performance when supplied with a low voltage power supply.

To preserve amplifier performance with low power supply voltages, it is often desirable to use amplifier architectures that do not require large voltage headroom. In battery powered applications, the current used in each stage of the amplifier should be reduced as much as possible to reduce power consumption. In these low power applications, it often necessary for circuits to have a power down mode where the operating current is reduced to negligible levels. To accomplish this, internal current sources are turned off and there should be no floating nodes that can conduct current.

One typical way in which to reduce power consumption within an amplifier is to tie the gate voltages to a power supply of p-type transistors, turn off the current sources, and otherwise ensure there is no direct current path from the power source to ground during times when the amplifier is not in use. However, after the amplifier receives a signal, such as a differential pair of signals on an input stage, the amplifier must come out of the power-down mode, sometimes referred to as the "sleep state." Of course, there may be other commands for initiating a power-up status besides simply applying a differential pair of signals to the input. The power-up status begins by initiating optimal voltages and currents onto the amplifier so that when the differential signals are received within a gain stage of the amplifier, the amplifier can quickly operate in its normal operating condition. The startup sequence should also be fairly short and, importantly, must not consume a significant amount of power either in the gain stage or the next stage, which is sometimes referred to as the output stage. Unfortunately, however, typical amplifier circuits that implement a power-down (or sleep state) followed by a power-up sequence before entering a normal operation condition, consume significant amounts of power or otherwise take undesirably long periods for the power-up sequence to occur. Even so, such conventional circuits may not place the internal nodes of the gain stage at their optimal levels, taking into consideration the common mode voltage of the differential signals applied to those nodes.

Many conventional amplifier circuits that utilize a differential amplifier also have common mode feedback from the output stage back to the gain stage. The feedback can measure the common mode voltage at the output, compare that common mode voltage to the desired common mode value, and make the appropriate adjustments to the gain stage to ensure it remains centered on the desired common mode value. Also, conventional operational amplifiers utilize what is known as "compensation capacitors" across the input and output of the gain stage. The compensation capacitors serve many functions, one of which is to prevent oscillations or unwanted glitches from occurring within the feedback path of the amplifier. One mechanism in which to reduce the power-up time is to use smaller compensation capacitors or larger current sources within the gain stage. However, reducing the compensation capacitor sizes can compromise amplifier stability, and increasing the current sources will increase the power consumption of the amplifier. Therefore, a need remains for an improved amplifier design that reduces the power-up time needed for placing the compensation capacitors in their optimal voltage values from a sleep state to a normal, operational state. Moreover, the improved amplifier design must have minimal power consumption during the power-up state, with reduced power-up time without increasing the power or area consumed by the amplifier, or causing large variations in the output common mode voltage.

SUMMARY OF THE INVENTION

The problems outlined above may be in large part addressed by an improved amplifier circuit comprising a gain stage and a bias stage, which may be switchably connected to the gain stage during power-up operations. According to one embodiment, the gain stage may include a pair of common mode feedback transistors coupled in parallel between a power supply node and a pair of compensation capacitors, such that mutually-coupled gate terminals of the common mode feedback transistors can be connected to positive terminals of the compensation capacitors.

During a power-up operation, the bias stage may be connected to the gain stage for supplying a bias current to negative terminals of the compensation capacitors. The power-up operation desirably occurs after the amplifier comes out of a sleep state or power-down state, and before the amplifier enters an operational state. The power-up operation is one in which a bias circuit within the bias stage supplies a first bias voltage above a ground supply to a first node of the respective pair of compensation capacitors. The bias circuit also supplies a second bias voltage below the power supply to the second nodes of the pair of compensation capacitors. The first nodes can be the negative terminals of the compensation capacitors, and the second nodes can be the positive terminals of the compensation capacitors. The positive terminals can also be coupled to the mutually-connected gate terminals of the pair of transistors.

A differential signal can be used to signal the amplifier transitioning from the power-up state to an operational state. Alternatively, a separate signal can be used. If so, the first and second bias voltages are supplied prior to the differential signal being applied to the first nodes via a current source. It may be that the first and second bias voltages are terminated prior to the differential signals being applied. In other words, the power-up state terminates before the operational state—the operational state being the state in which the differential signals are amplified in the gain stage of the amplifier. The first and second bias voltages are, therefore, supplied during the power-up stage and after the sleep or power-down stage is terminated. Thus, the first and second bias voltages are supplied after the power supply is applied to and thereafter removed from the second nodes, in which the mutually-coupled gate terminals of the pair of transistors are also connected.

The first bias voltage can be approximately equal to a gate-to-source voltage of a transistor above a ground supply. The first bias voltage is preferably less than the common mode voltage, and the second bias voltage can be approximately equal to the common mode voltage. A feedback circuit is coupled to place a common mode voltage of a pair of differential signals upon the mutually-coupled gate terminals, which are referred to as the second nodes of the pair of transistors.

According to one embodiment, the bias stage may include a current mirror that is switchably connected to the gain stage for supplying the bias current to the negative terminals of the compensation capacitors through a first pair of switches. During power-up, the first pair of switches may be closed for charging the negative terminals of the compensation capacitors to a first voltage level. In some cases, the bias stage may include a diode-connected transistor coupled between the power supply node and the current mirror, such that a gate terminal of the diode-connected transistor is switchably connected to the positive terminals of the compensation capacitors through a second pair of switches. During power-up, the second pair of switches may also be closed for charging the positive terminals of the compensation capacitors to a second voltage level.

In some cases, the first voltage level may be greater than a ground potential, whereas the second voltage level may be close to the common mode feedback voltage supplied to the mutually-coupled gate terminals of the common mode feedback transistors. The bias stage may be switchably connected to the gain stage for supplying a ground referenced bias voltage to the negative terminals of the compensation capacitors and a VDD referenced bias voltage to the positive terminals of the compensation capacitors during a power-up operation. In this manner, the bias stage may reduce a potential difference between the positive and negative terminals of the compensation capacitors, thereby reducing the amount of time needed to fully charge the compensation capacitors during power-up. By controlling the manner in which both terminals are charged, the bias stage reduces the power-up time without compromising control of the voltage present at the output nodes of the gain stage.

BRIEF DESCRIPTION OF THE DRAWINGS

Other objects and advantages of the invention will become apparent upon reading the following detailed description and upon reference to the accompanying drawings in which.

Figure 1:
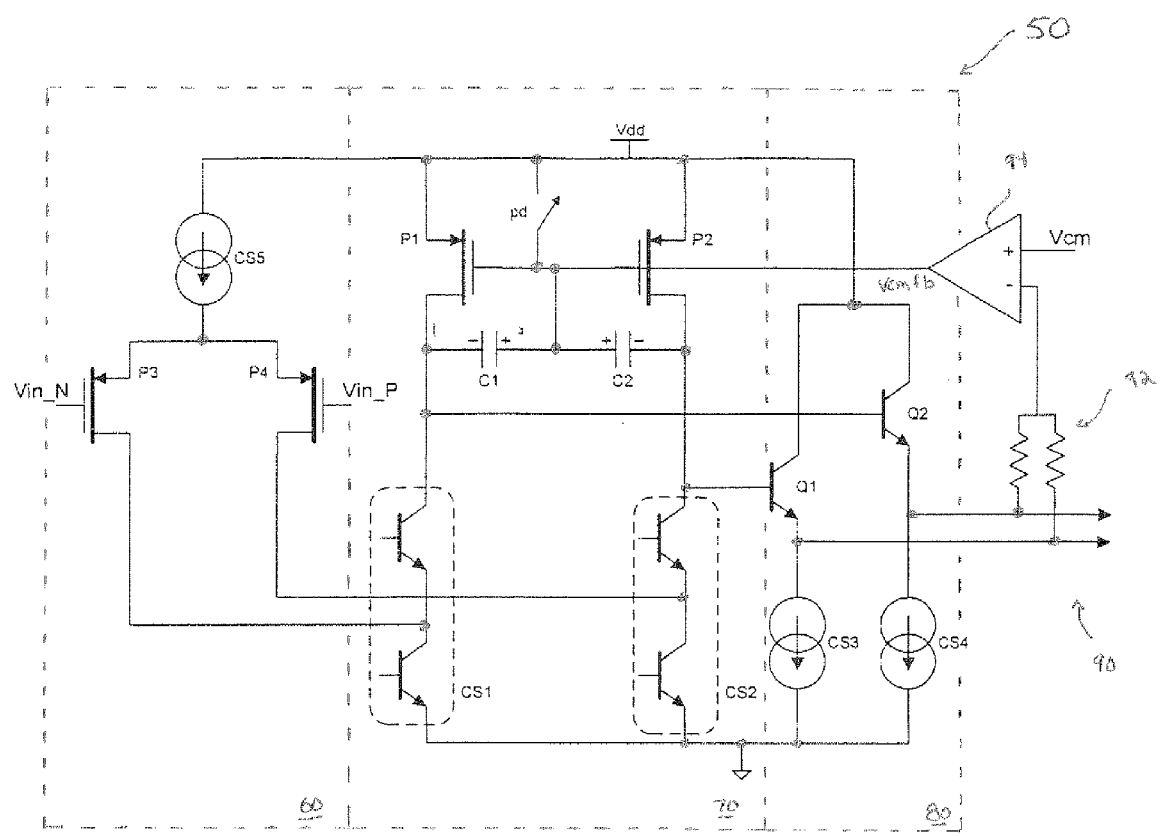
FIG. 1 is a circuit diagram of a input/Gm stage, followed by a gain stage, and followed by an output stage of an overall, exemplary amplifier circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a multi-stage amplifier 50. Amplifier 50 includes an input or Gm stage 60, a gain stage 70, an output stage 80, and a common mode feedback stage 90. Input stage 60 can receive differential inputs (Vin_N and Vin_P). Transistors P3 and P4 are coupled in cascode with a current source (CS5) to provide a gain on the output to the next stage 70. Stage 70 includes another pair of cascode-connected transistors P1 and P2, a pair of compensation capacitors (C1 and C2), and a pair of current sources (CS1 and CS2). The negative terminal of capacitors C1 and C2 are connected to the output of gain stage 70, which feeds to the input of output stage 80 and, more specifically, to the gate (or base) of transistors Q1 and Q2. Transistors Q1 and Q2 provide current at their respective emitter terminals to current sources CS3 and CS4, which produce the corresponding output from amplifier 50 and, in addition, feed a resistor-divider circuit 92 of feedback stage 90. The resistor-divider produces the common mode voltage at the output and compares it to the desired common mode voltage (Vcm) at the input of an amplifier or amplifier coupled as a comparator 94. Depending on whether the fed back common mode voltage is greater than or less than Vcm, the output (vcmfb) can be increased or decreased until, ideally, vcmfb=Vcm. The common mode feedback voltage (vcmfb) is coupled to the gate terminals of transistors P1 and P2 within gain stage 70.

Amplifier circuit 50 is desirably put in a sleep state or power-down mode when not in use. Thus, when there are no differential inputs upon transistors P3 and P4, the gain stage as well as other stages desirably consume minimal power. For example, a power-down (pd) switch can couple the inputs of transistors P1 and P2 to a power supply, and the bias voltage upon CS1 and CS2 is removed so that the current within current sources CS1 and CS2 are no longer active and, therefore, no longer sourcing any current. It may also be desirable that the output nodes from gain stage 70 be tied to ground so that the next stage (output stage 80) also does not consume power by transistors Q1 and Q2 being active.

Unfortunately, when the output nodes of gain stage 70 are placed at ground and the input to transistors P1 and P2 are placed at the power supply voltage, the entire power supply voltage is coupled across compensation capacitors C1 and C2 when the gain stage comes out of the power-down mode or sleep state, and enters a power-up mode just before the differential signals are applied, it is difficult for the positive and negative terminals of compensation capacitors C1 and C2 to be quickly placed in their nominal voltage value. For example, it would be desirable that the second node or positive terminal of capacitors C1 and C2 be placed near a common mode voltage, and the first node or negative terminal of capacitors C1 and C2 be placed slightly above ground during the power-up state. Yet, however, removing the power supply from the second node and removing the ground supply from the first node will take an unduly long period of time based on the leakage from the RC network. This problem is more clearly illustrated in reference to FIG. 2.

Figure 2:
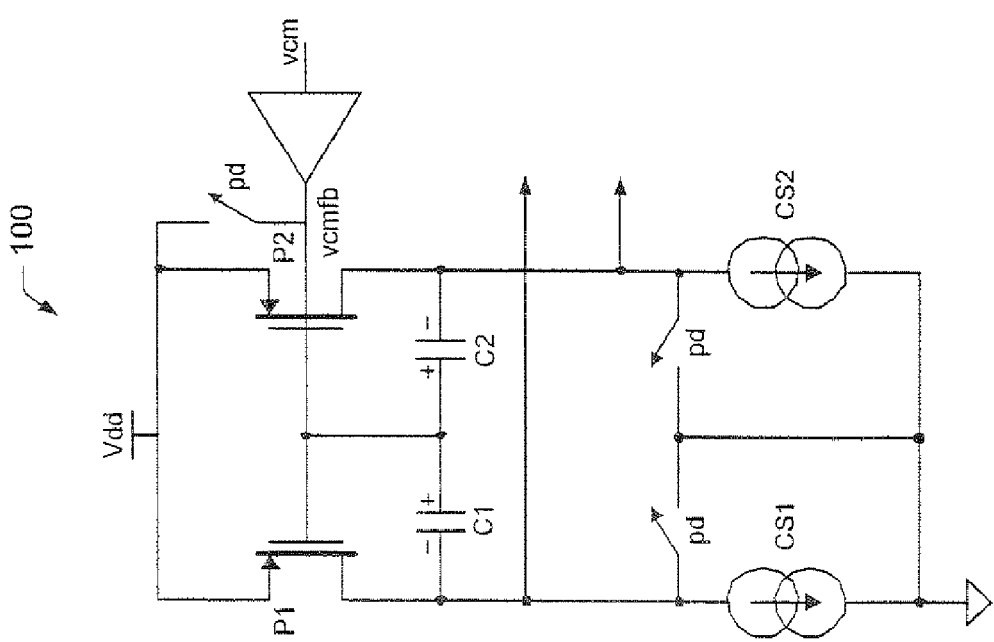
FIG. 2 is a circuit diagram of an exemplary gain stage of a differential amplifier, the gain stage including a pair of compensation capacitors.

FIG. 2 illustrates one example 100 of gain stage 70. Therefore, gain stage 100 is a portion of an amplifier circuit 50 of FIG. 1. In the embodiment of FIG. 2, gain stage 100 is the high-impedance portion of a differential gain stage with a common mode feedback voltage (vcmfb) coupled to transistors P1, P2. The inputs to the differential amplifier can come from either an NMOS or PMOS differential pair serving as a gm stage. Transistors P1, P2 are each coupled in series between a low voltage power supply node (VDD) and a different one of current sources CS1, CS2. To improve the stability of the gain stage, compensation capacitors C1, C2 are coupled between the inputs and outputs of the gain stage to prevent oscillations from occurring within the feedback path. In the embodiment of FIG. 2, the positive terminals of the compensation capacitors are coupled to the input of the common mode gain stage at the mutually-coupled gate terminals of transistors P1, P2, while the negative terminals are coupled to the output of the gain stage at the drain terminals of transistors P1, P2. Values for the compensation capacitors are typically chosen to bring the open-loop gain of the amplifier to unity before phase shifts caused by other amplifier stages become significant. However, the actual size chosen for the compensation capacitors may depend on several parameters and is very design specific.

In some cases, gain stage 100 may be powered down to conserve power in a sleep state. During power-down, current sources CS1, CS2 are turned off and a plurality of switches (pd) are closed to pull the gates of transistors P1 and P2 along with the positive terminals of capacitors C1 and C2 to VDD, and to connect the negative terminals of compensation capacitors C1, C2 and current sources CS1, CS2 to ground. When the amplifier receives a power-up command, current sources CS1, CS2 gradually increase drive current levels until compensation capacitors C1, C2 are charged from a ground potential to the proper operating point. Unfortunately, the power-up time or the time it takes to fully charge compensation capacitors C1, C2 to proper operating levels, may be undesirably long in low power amplifier designs that utilize large compensation capacitors and small current sources.

In particular, the power-up time may be undesirably long in the embodiment of FIG. 2 because the current paths available for charging compensation capacitors C1 and C2 are turned off at the beginning of the power-up sequence. In other words, when the power down switches are opened, the compensation capacitors are charged to have the power supply voltage across them. However, the current needed to discharge the capacitors must come from either transistor P1 and current source CS1 in one branch, or transistor P2 and current source CS2 in the other branch. These transistors (P1, P2) and current sources (CS1, CS2) are initially turned off at the beginning of the power-up sequence. Eventually, leakage current will charge capacitors C1 and C2, such that the current in transistors P1, P2 and current sources CS1, CS2 turns on, although, the time it takes to do so is relatively long.

Figure 3:
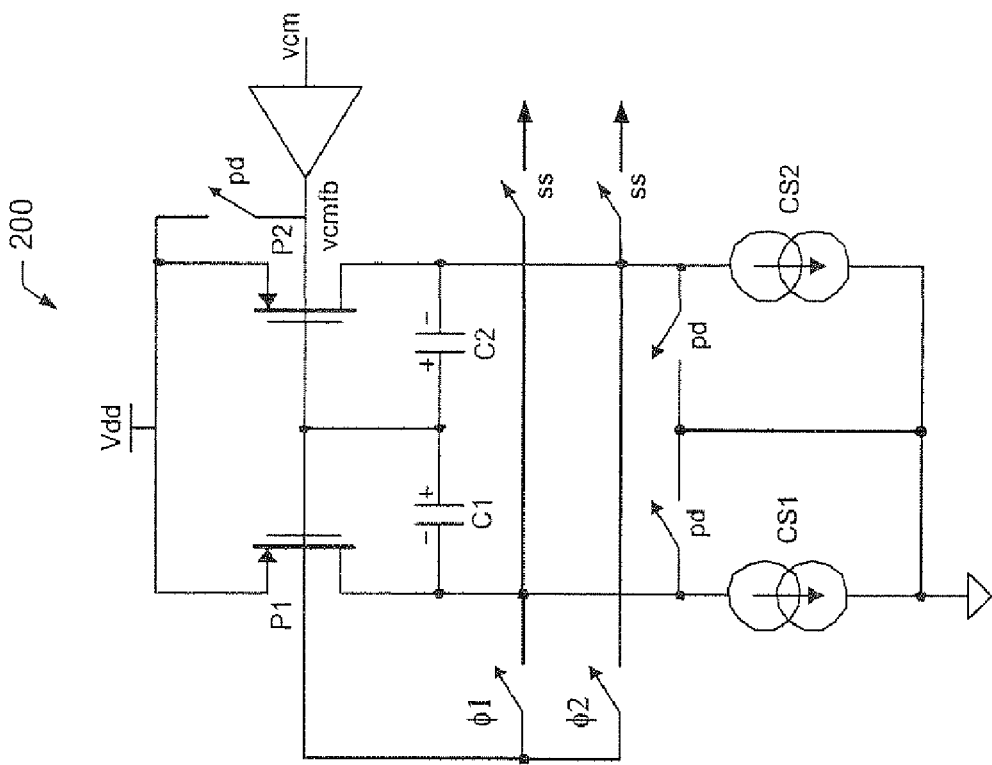
FIG. 3 is a circuit diagram of the gain stage of FIG. 2, including a first pair of switches between the positive and negative terminals of the compensation capacitors and a second pair of switches between the output nodes of the gain stage and the input nodes of the next stage.

FIG. 3 illustrates another embodiment of a differential gain stage 200 that may be used within a low power amplifier circuit and, specifically, as the gain stage 70 of amplifier 50. In addition to the circuit elements provided in FIG. 3, gain stage 200 attempts to reduce the amplifier power-up time by adding an additional pair of switches (φ1, φ2) between the inputs and the outputs of the common mode gain stage. The additional pair of switches is used for shorting the positive terminals to the negative terminals of the compensation capacitors during power-up. As shown in FIG. 3, for example, switch (φ1) may be coupled between the positive and negative terminals of compensation capacitor C1, while switch (φ2) is similarly coupled between the positive and negative terminals of compensation capacitor C2. Thus, the additional pair of switches may be closed to temporarily short-out compensation capacitors C1, C2 during power-up, so as to quickly bring the gain stage 200 from the power-down state into a state where the current in P1, P2, CS1, and CS2 is in the range of a nominal operating value.

Figure 5:
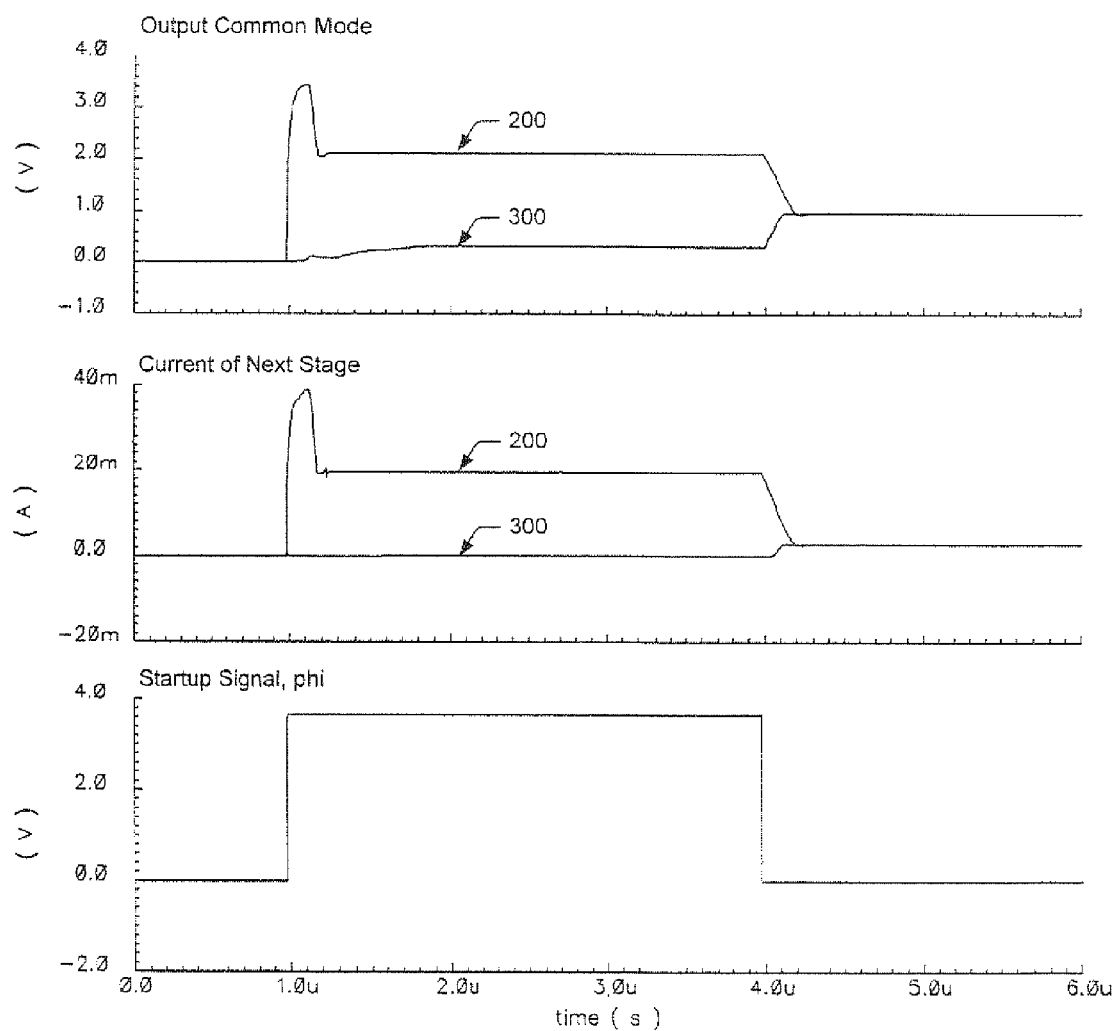
FIG. 5 is a simulation waveform of a controlled vs. uncontrolled power-up operation conducted by two different amplifier designs.

Upon receiving a power-up command, the additional pair of switches (φ1, φ2) may be closed long enough to discharge compensation capacitors C1 and C2. After this time, the additional switches (φ1, φ2) are opened to allow current from the common mode feedback loop to gradually charge capacitors C1, C2 to the proper operating levels. The time needed for charging capacitors C1, C2 is reduced, in the embodiment of FIG. 3, by quickly discharging compensation capacitors C1 and C2 to bring the current in P1, P2, CS1, and CS2 to its normal operating level, thereby allowing the common mode feedback loop to settle quickly. Unfortunately, use of switches (φ1, φ2) may cause large variations in the common mode output voltage of gain stage 200. For example, closing switches (φ1, φ2) may cause a relatively high voltage (e.g., VDD) to be supplied to the output nodes of the gain stage. Once the switches (φ1, φ2) are opened, the common mode feedback loop may begin to settle and bring the output common mode voltage back to the correct level. However, the rather instantaneous connection to the high voltage may cause the common mode voltage to "glitch" at the output nodes of the gain stage. An exemplary glitch is illustrated in FIG. 5, but may be generally described herein as an uncontrollable rise to an unexpected voltage level.

In some cases, large variations in common mode output voltage may cause the next amplifier stage to consume undesirably large amounts of current in a mode (i.e., a power-up mode) never intended for normal operational levels. In some cases, the current consumption can be as high as 40 mA (or more), as shown in FIG. 5 and described in more detail below. Such high current consumption may increase the danger for latch-up, a condition that occurs when large amounts of current injected into the substrate causes a parasitic Silicon Controlled Rectifier (SCR) to turn on, which creates a low impedance path between power and ground, resulting in transistor breakdown. In addition to latch-up concerns, high current consumption may reduce battery life and/or prohibit the amplifier circuit from being used in battery-powered applications (e.g., where a preferred circuit design may consume about 25 mA during normal operating modes).

In an effort to avoid high current consumption in the next stage, series switches (ss) may be coupled between the output nodes of the gain stage and the input nodes of the next stage, as shown in FIG. 3. The switches are introduced into the signal path to isolate the outputs of the gain stage during power-up. However, adding switches (ss) may introduce undesirable amounts of noise into the signal path, as well as the possibility for increased power consumption, area and design time.

Figure 4:
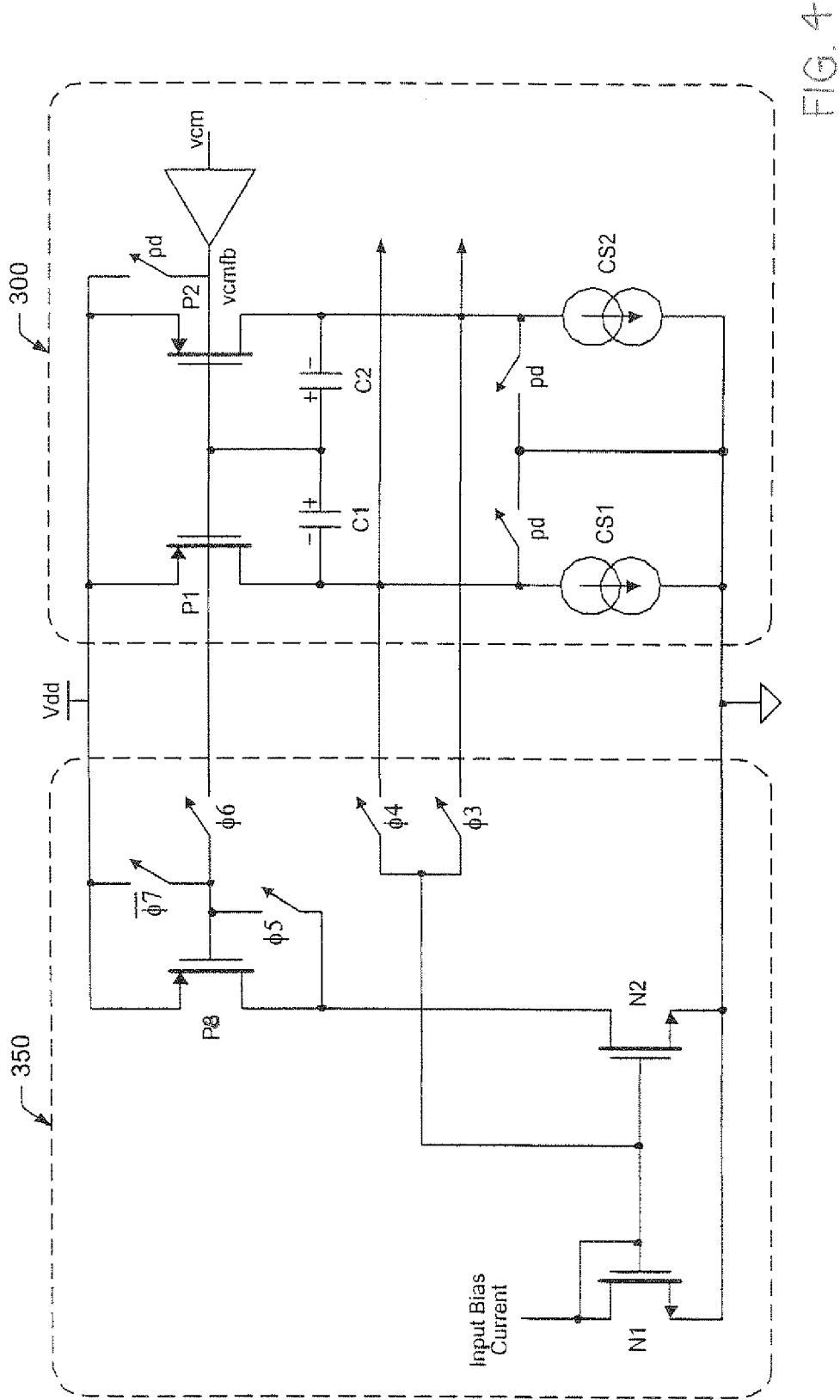
FIG. 4 is a circuit diagram of an improved amplifier design with a biasing stage switchably connected to the gain stage of the differential amplifier for controlling the manner in which the compensation capacitors are charged to a desired common mode level.

FIG. 4 illustrates a preferred embodiment of a differential gain stage 300 for use within a low power amplifier circuit. Instead of simply adding a pair of switches between the positive and negative terminals of capacitors C1 and C2, as shown in FIG. 3, the present invention includes a bias stage 350 for controlling the manner in which compensation capacitors C1, C2 are charged during power-up. As described in more detail below, bias stage 350 may provide a reliable power-up block to the gain stage. In other words, bias stage 350 may be used to ensure that the output nodes of the gain stage rise from a ground potential to a desired common mode level in a highly controlled and predictable manner.

Though bias stage 350 is illustrated in conjunction with a particular gain stage design (similar to the ones shown in FIGS. 2-3), bias stage 350 may also be used with other gain stage designs that suffer from slow power-up due to large capacitances connected to internal nodes of the amplifier. The capacitance may not be provided by large capacitors, in all embodiments of the invention. For example, a large capacitance may be provided by a large MOS transistor whose gate capacitance represents a significant load.

Like other embodiments, gain stage 300 may be powered down to conserve power in a sleep state. During power-down, current sources CS1, CS2 are turned off and a plurality of switches (pd) are closed to pull the common mode feedback node and the positive terminals of capacitors C1 and C2 to VDD, and to short the negative terminals of compensation capacitors C1, C2 and current sources CS1, CS2 to ground. The bias current present at the input of bias stage 350 is turned off during power-down and is only connected to the gain stage 300 for a short power-up time that is determined by the amount of time required to charge capacitors C1 and C2. For example, bias stage 350 may be switchably connected to gain stage 300 via a plurality of switches ($\phi3 \ldots \phi7$). During power-down and operational modes, switches ($\phi3 \ldots \phi6$ may be opened and switch $\phi7$ may be closed to disconnect bias stage 350 from gain stage 300.

According to one embodiment, bias stage 350 may include a current mirror implemented, e.g., with n-channel MOSFET (NMOS) transistors N1 and N2. The gate and drain terminals of transistor N1 may be diode connected for receiving the bias current, which may also be supplied to the gate terminal of transistor N2 and a first pair of switches ($\phi3$, $\phi4$). In this manner, the current mirror may be "switchably connected" to the gain stage for supplying the bias current to the negative terminals of the compensation capacitors through the first pair of switches ($\phi3$, $\phi4$). As described in more detail below, the first pair of switches may be closed during power-up for charging the negative terminals of the compensation capacitors to a first voltage level. The bias stage may further include a diode-connected transistor, which may be implemented, e.g., with a p-channel MOSFET (PMOS) transistor P8 coupled between the power supply node (VDD) and the current mirror. The gate terminal of transistor P8 may be switchably connected to the mutually-coupled gate terminals of transistors P1, P2 through a second pair of switches ($\phi5$, $\phi6$). As described in more detail below, the second pair of switches may be closed during power-up for charging the positive terminals of the compensation capacitors to a second voltage level.

During power-up, switches pd are opened. At the same time, switches ($\phi3 \ldots \phi6$ are closed and switch $\phi7$ is opened for connecting bias stage 350 to gain stage 300. As noted above, for example, switches $\phi3$, $\phi4$ may be closed for supplying the bias current to the negative terminals of the compensation capacitors. In doing so, the negative terminals of capacitors C1 and C2 are charged to a first voltage level through use of the input bias current. In some cases, the first voltage level may be somewhat greater than a ground potential. In a preferred embodiment, the bias current may be used for charging the negative terminals of the compensation capacitors to the gate-source voltage of transistor N1 or $V_{GS}$(N1).

In addition, switches $\phi5$, $\phi6$ may be closed and switch $\phi7$ may be opened for turning on transistor P8 and charging the positive terminals of compensation capacitors C1, C2 to a second voltage level. Once on, transistor P8 may enable the positive terminals of the compensation capacitors to be charged to approximately VDD-$V_{GS}$(P8). In a preferred embodiment, the value of VDD-$V_{GS}$(P8) may be set relatively close to the common mode feedback voltage (vcmfb). This may eliminate the possibility of glitches by providing a smooth transition between the voltages seen by the positive terminals of the compensation capacitors before and after switches $\phi5$, $\phi6$ are closed. Since the bias current ultimately controls the level of $V_{GS}$(P8) (i.e., by controlling the amount to which transistors N1, N2 and P3 are turned on), the bias current may be selected so that VDD-$V_{GS}$(P8) may be substantially equal to the common mode feedback voltage (vcmfb). Depending on design specifications, the bias current may range between about 10 µA and about 1 mA, in some cases.

Unlike the pair of switches ($\phi1$, $\phi2$) used in the embodiment of FIG. 3, bias stage 350 provides a predictable power-up behavior, which is independent of the power supply voltage. For example, bias stage 350 may be switchably connected to the gain stage during power-up operations for charging the negative terminals of the compensation capacitors to a first voltage level, and the positive terminals of the compensation capacitors to a second voltage level. Instead of depending on the power supply, the first and second voltage levels may each depend, at least to some degree, on the chosen level of the bias current. In a general embodiment, the second voltage level may be set close to the common mode feedback voltage supplied to the mutually-coupled gate terminals of input transistors P1, P2. The first voltage level may be somewhat greater than a ground potential. In this manner, the bias stage may reduce a potential difference between the positive and negative terminals of the compensation capacitors, thereby reducing the power-up time needed to fully charge the compensation capacitors by quickly bringing the currents in P1, P2, CS1, and CS2 to their nominal operating levels.

The bias stage may also reduce or eliminate any glitches that may occur in the common mode output voltage by setting the first voltage level below the final settled value, but high enough to allow current sources CS1 and CS2 to turn on. In other words, bias stage 350 ensures that the output nodes of gain stage 300 will rise from ground to a desired common mode level in a highly controlled and predictable manner. By providing a predictable power-up behavior, bias stage 350 reduces current consumption in the next amplifier stage following gain stage 300. This may reduce the possibility for latch-up in the next stage, while improving device reliability and improving battery life (in battery-powered applications). A predictable power-up behavior also enables the output nodes of the gain stage to be directly connected to the input nodes of the next stage, thereby eliminating the need for series switches (ss) within the signal path. As such, the amplifier design described herein provides a high-speed, reliable amplifier design with reduced noise, power and area consumption.

It is appreciated that the combination of a bias stage 350 and gain stage 300 can be inserted into the overall amplifier circuit 50 (FIG. 1). Instead of gain stage 70 as illustrated in FIG. 1, gain stage 70 can be removed and circuits 300 and 350 substituted therefor. Current sources CS1 and CS2 are controlled by the output from stage 60, and the common mode feedback voltage (vcmfb) is sent into gain stage 30 via feedback circuit 90 (FIG. 1). The power-down state is initiated when switches pd are closed, and switches φ3-φ6 are open while switch φ7 is closed. Subsequent to the power-down state, a power-on state can occur when the power-down switches pd and switch φ7 are open. Switches φ3-φ6 are closed, and the power-on state remains while switches φ3-φ6 are closed.

FIG. 5 is a simulation waveform of a controlled vs. uncontrolled power-up operation conducted by two different amplifier designs. In particular, FIG. 5 shows the common mode output voltage at the output nodes of gain stages 200 and 300, as well as the amount of current consumed in the next stages, when a power-up command (phi) is asserted for 3 µs. As shown in FIG. 5, the common mode output voltage of gain stage 200 rises uncontrollably from a ground potential to above 3.0 V before settling to about 1.0 V after the power-up signal is removed. On the other hand, the common mode output voltage of gain stage 300 rises gradually from the ground potential to the settling voltage of about 1.0V. Unlike gain stage 200, the output nodes of gain stage 300 rise in a highly controlled and predictable manner. FIG. 5 also shows that the amplifier stage following gain stage 200 may consume as much as 40 mA of current when the power-up signal is first asserted. Because bias stage 350 eliminates the occurrence of glitches at the output nodes of gain stage 300, the amplifier stage following gain stage 300 consumes substantially no current during the power-up operation.

Figure 6:
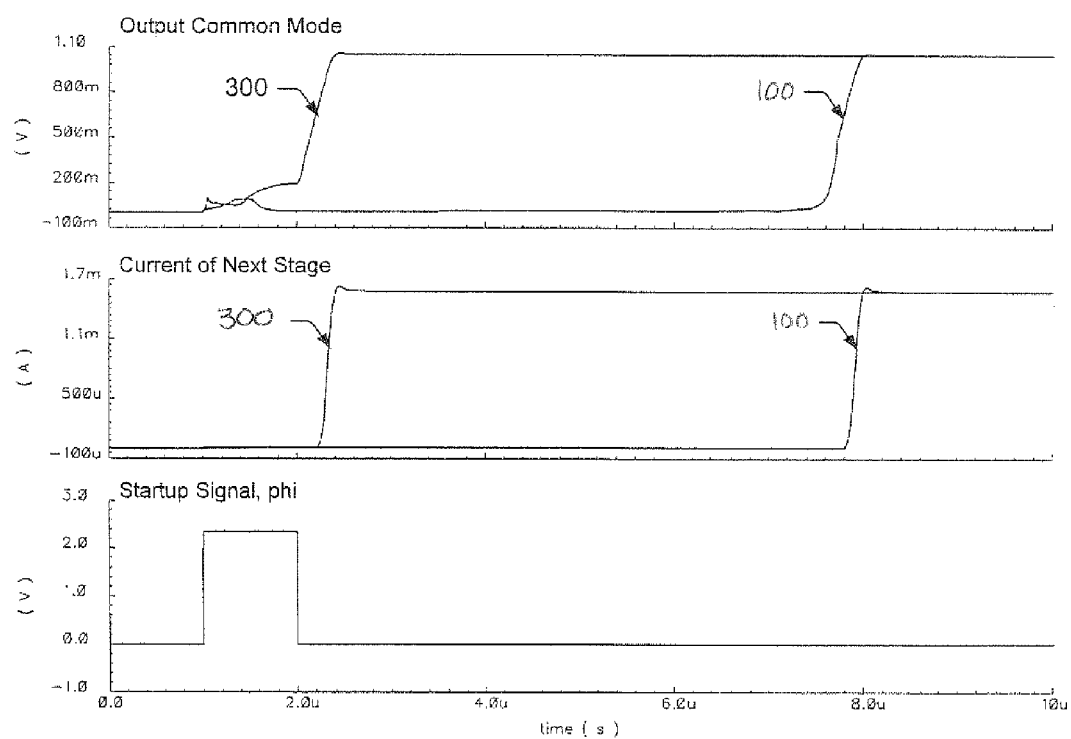
FIG. 6 is a simulation waveform illustrating the reduced power-up time for the amplifier design of FIG. 4 versus the amplifier design of FIG. 3 when switches ($\phi 1$, $\phi 2$) are eliminated from the design.

FIG. 6 is a simulation waveform illustrating the reduced power-up time for gain stage 300, as compared to gain stage 100 when switches (φ1, φ2) are eliminated from the design. In particular, FIG. 6 shows the common mode output voltage at the output nodes of gain stages 100 and 300, as well as the amount of current consumed in the next stages, when a power-up command (phi) is asserted for 1 µs As shown in FIG. 6, the output common mode voltage of gain stage 100 takes approximately 7 µs to settle. On the other hand, the output common mode voltage of gain stage 300 settles in about 1.5 µs, a significant improvement over prior art designs. The fast settling time of gain stage 300 also means that less current is consumed during power-up. For example, approximately 1.7 mA of current may be consumed by the stage following gain stage 100 during power-up operations. This is compared to substantially no current consumption in the stage following gain stage 300.

It will be appreciated to those skilled in the art having the benefit of this disclosure that this invention is believed to provide an improved amplifier design that reduces power-up time without compromising control of the gain stage output voltages. This is contrary to conventional amplifier designs, which tend to trade power-up time for control (or vice versa). Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An amplifier circuit, comprising:
   a pair of transistors directly electrically connected between a power supply and first nodes of a respective pair of capacitors, wherein a gate terminal of each of the pair of transistors is mutually coupled to each other and to second nodes of the respective pair of capacitors; and
   a bias circuit adapted to supply a first bias voltage above a ground supply to the first nodes and to supply a second bias voltage below the power supply to the second nodes.

2. The amplifier circuit as recited in claim 1, wherein the first bias voltage is supplied prior to differential signals being applied to the first nodes.

3. The amplifier circuit as recited in claim 1, wherein the first bias voltage is terminated prior to differential signals being applied to the first nodes.

4. The amplifier circuit as recited in claim 1, wherein the first bias voltage is supplied after the power supply is applied to and thereafter removed from the second nodes.

5. The amplifier circuit as recited in claim 1, wherein the first bias voltage is approximately equal to a gate-to-source voltage of a transistor above the ground supply.

6. The amplifier circuit as recited in claim 1, further comprising a feedback circuit coupled to place a common mode voltage of a pair of differential signal upon the mutually coupled gate terminals.

7. The amplifier circuit as recited in claim 6, wherein the first bias voltage is less than the common mode voltage.

8. The amplifier circuit as recited in claim 6, wherein the second bias voltage is approximately equal to the common mode voltage.

9. An amplifier circuit, comprising:
   a gain stage having a pair of common mode feedback transistors coupled in parallel between a power supply node and a pair of compensation capacitors, such that mutually coupled gate terminals of the common mode feedback transistors are connected to positive terminals of the compensation capacitors; and
   a bias stage switchably connected to the gain stage for supplying a first bias current to negative terminals of the compensation capacitors and a second bias current to the positive terminals of the compensation capacitors, wherein the bias stage comprises a current mirror coupled for supplying the first bias current to a first pair of switches, which are closed for charging the negative terminals of the compensation capacitors to a first voltage level.

10. The amplifier circuit as recited in claim 9, wherein the first and second bias currents are supplied prior to applying a differential signal to the compensation capacitors.

11. The amplifier circuit as recited in claim 9, wherein the bias stage further comprises a diode-connected transistor coupled between the power supply node and the current mirror, wherein a gate terminal of the diode connected transistor is switchably connected to the positive terminals of the compensation capacitors through a second pair of switches, which are closed for charging the positive terminals of the compensation capacitors to a second voltage level.

12. The amplifier circuit as recited in claim 11, wherein the bias stage reduces a potential difference between the positive and negative terminals of the compensation capacitors to reduce an amount of time needed to fully charge the compensation capacitors during a power-up operation.

13. The amplifier circuit as recited in claim 12, wherein an amplitude of the first bias current is selected so that: the first voltage level will be greater than a ground potential; and the second voltage level will be approximately equal to a common mode feedback voltage supplied to the mutually coupled gate terminals of the common mode feedback transistors.

14. The amplifier circuit as recited in claim 9, wherein no switches are coupled between output nodes of the gain stage and input nodes of a following amplifier or buffer stage.

* * * * *